United States Patent [19]
Sadakata et al.

[11] Patent Number: 4,665,611
[45] Date of Patent: May 19, 1987

[54] METHOD OF FABRICATING SUPERCONDUCTIVE ELECTRICAL CONDUCTOR

[75] Inventors: Nobuyuki Sadakata; Yoshimitsu Ikeno; Masaru Sugimoto, all of Tokyo; Osamu Kohno, Chiba, all of Japan

[73] Assignee: Fujikura Ltd., Tokyo, Japan

[21] Appl. No.: 831,462

[22] Filed: Feb. 19, 1986

[51] Int. Cl.[4] .............................................. H01L 39/24
[52] U.S. Cl. .................................. 29/599; 174/126 S; 174/128 S
[58] Field of Search ............ 29/599; 174/126 S, 128 S

[56] References Cited

U.S. PATENT DOCUMENTS

| | | | |
|---|---|---|---|
| 3,838,503 | 10/1974 | Suenaga et al. | 29/599 |
| 3,868,769 | 3/1975 | Dosdat et al. | 29/599 |
| 3,905,839 | 9/1975 | Hashimoto | 29/599 X |
| 4,327,244 | 4/1982 | Horvath et al. | 29/599 X |
| 4,377,905 | 3/1983 | Agatsuma et al. | 29/599 |
| 4,489,219 | 12/1984 | Suenaga et al. | 29/599 X |
| 4,501,062 | 2/1985 | Hillmann et al. | 29/599 |
| 4,554,407 | 11/1985 | Ceresara et al. | 29/599 X |

Primary Examiner—Howard N. Goldberg
Assistant Examiner—Carl J. Arbes
Attorney, Agent, or Firm—Welsh & Katz, Ltd.

[57] ABSTRACT

A method of fabricating a superconductive electrical conductor of $Nb_3Sn$ type comprises a step of covering an elongated core member made of Nb with a covering member made of a third element selected from the group consisting of Ti, Ta, In, Hf, Al and Si. The core member covered with the covering member is covered with a tubular matrix made of a Cu-Sn alloy or a combination of Cu with Sn to form a composite wire element. Such wire elements are assembled in a tubular matrix made of a Cu-Sn alloy, Cu or a combination of Cu with Sn and reduced in diameter to form a multi-core composite wire element having a desired diameter. The assembling and reducing processing is effected at least one to form a multi-core composite wire which is then subjected to a diffusion heat-treatment to form an intermetallic compound of $Nb_3Sn$ and the third element in the peripheral portion of the core member.

10 Claims, 11 Drawing Figures

FIG.I(A)
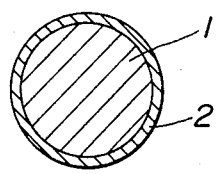
FIG.I(B)
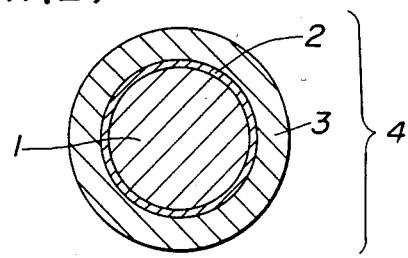
FIG.I(C)
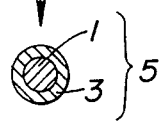
FIG.I(D)
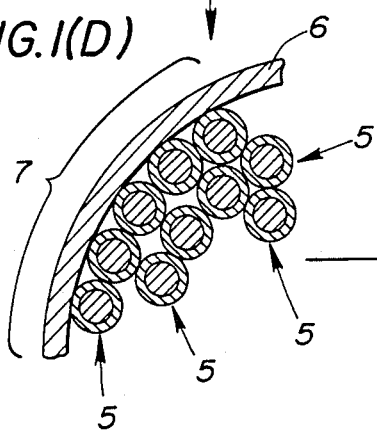
FIG.I(E)
FIG.I(F)
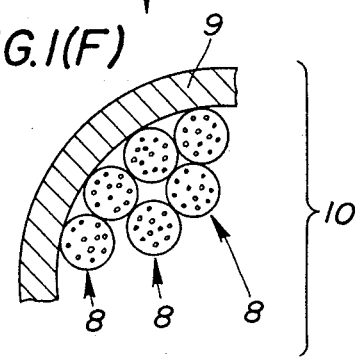
FIG.I(G)
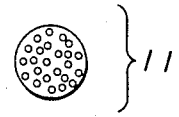
FIG.I(H)
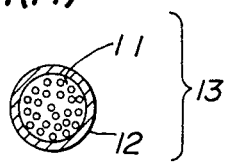

METHOD OF FABRICATING SUPERCONDUCTIVE ELECTRICAL CONDUCTOR

BACKGROUND OF THE INVENTION

1. Field of the Invention

The present invention relates to a method of fabricating a superconductive electrical conductor of $Nb_3Sn$ type.

2. Related Art Statement

Hitherto, it was difficult to put to practical use a superconductive material of an intermetallic compound type, which is said to be superior in various superconductive characteristics to a superconductive material of an alloy type, because of a low workability of the intermetallic compound type superconductive material. However, the intermetallic compound type superconductive material has been led to be widely put to practical use by the development of a fabricating method utilizing a metallic diffusion reaction in which a working is applied to the materials under such a composite condition that the intermetallic compound is not yet formed, and after the working a diffusion heat-treatment is applied to the materials to produce the intermetallic compound.

There is a superconductive material of $Nb_3Sn$ type as one among the above-described intermetallic compound type superconductive materials, which is high in critical temperature (Tc) and, further, is easy in generation of strong magnetic field. Hitherto, a bronze method and an Sn plating method have been known as a typical method of fabricating a superconductive electrical conductor, in which the $Nb_3Sn$ type superconductive material is utilized. The former bronze method is arranged such that an Nb filament is disposed in a matrix of a Cu-Sn alloy (bronze) having an Sn concentration desirably on the order of 10 to 15 wt. % to form a composite wire or cable having a predetermined diameter and, subsequently, a diffusion heat-treatment is applied to the composite wire to diffuse the Sn contained in the Cu-Sn alloy, to provide a superconductive electrical conductor having therein the $Nb_3Sn$ filament. The latter Sn plating method is arrange such that an Nb filament is disposed in a matrix of pure Cu or of a Cu-Sn alloy so as to provide a wire a predetermined diameter, an Sn plating is subsequently applied to an outer periphery of the Cu matrix and, subsequently, a diffusion heat-treatment takes place to diffuse Sn from the plating layer through the Cu matrix, to provide a superconductive electrical conductor having therein the $Nb_3Sn$ filament.

It has been said, however, that although $Nb_3Sn$ produced by the diffusion reaction of Nb-Sn represented by the above-described bronze method and the Sn plating method indicates high critical current density (Jc) in an external magnetic field up to 10T (tesla), the Jc value is rapidly decreased in the magnetic field higher than 10 T.

Recently, is has been found that if a third element such as, for example, Ti, Si, and Hf other than Nb and Sn is added into the Nb filament or the bronze matrix, the decreasing rate of the Jc value can be improved in the higher magnetic field range above the vicinity of 10 T. Accordingly, the third element has been added to fabricate the $Nb_3Sn$ type superconductive electrical conductor. In practice, in the fabrication of the $Nb_3Sn$ type superconductive electrical conductor containing the third element, the Nb filament which has added thereto the third element and is alloyed is utilized, or the bronze matrix which has added thereto the third element and is alloyed is utilized, or an alloy in which the third element is contained in Sn by a diffusion process is utilized. There has been known another method of fabricating the $Nb_3Sn$ type superconductive electrical conductor in which a Nb filament is plated with the third element prior to forming a composite wire to be subjected to a diffusion heat-treatment.

When the superconductive electrical conductor is fabricated in a manner as described above, it is required, in any case, to manufacture an alloy containing the third element. In the third elements, however, there is a metal such as Ti which is extremely active at high temperatures. Thus, in order to alloy Nb, Cu, Sn or the like with such third element, it is necessary to utilize a special dissolution process which is high in cost, such as, for example, a vacuum arc dissolution process or an electron beam dissolution process. This results in the increase in manufacturing cost. In addition, since Sn is extremely low in melting point, it is significantly difficult to alloy Sn with Ti or Ta which is high in melting point. Moreover, there is a fear that the third element causes segregation to occur upon casting, which lowers the quality of the conductor and, therefore, a problem also arises that the addition of the third element causes the workability of the bronze matrix or the Nb filament to be deteriorated.

With the aforesaid method in which the third element is plated on the Nb filament, it is extremely difficult to form the plating layer of the third element of a uniform and a desired thickness and having no surface defect. It is also difficult to work or draw the Nb filament plated with the third element since the plating layer of the third element is liable to crack and to be peeled off the Nb filament.

SUMMARY OF THE INVENTION

An object of the present invention is therefore to provide a method of fabricating a superconductive electrical conductor of $Nb_3Sn$ type, which can provide the superconductive electrical conductor having superior characteristics, more easily than the conventional method without the damage of a workability of the conductor.

According to the present invention, there is provided a method of fabricating a superconductive electrical conductor of $Nb_3Sn$ type, which comprises the steps of covering an elongated core member made of Nb with a covering member consisting of a third element for improvement of a critical current of $Nb_3Sn$ contained in the superconductive electrical conductor; covering the elongated core member covered with the covering member with a first tubular matrix made of any one of a Cu-Sn alloy and a combination of Cu with Sn to form a first composite wire element; reducing the first composite wire element to a predetermined diameter to form a second composite wire element; assembling a predetermined number of the second composite wire elements in a second tubular matrix made of any one of a Cu-Sn alloy, Cu and a combination of Cu with Sn to form a third composite wire element; reducing the third composite wire element to a predetermined diameter to form a fourth composite wire element; assembling a predetermined number of the fourth composite wire elements in a third tubular matrix made of any one of a Cu-Sn alloy, Cu and a combination of Cu with Sn, and subsequently reducing the third tubular matrix having therein the fourth composite wire elements to a predetermined diameter to form a multi-core composite wire; and subjecting the multi-core composite wire to a diffusion heat-treatment to form an intermetallic compound of Nb$_3$Sn and the third element in a peripheral portion of the Nb core member.

BRIEF DESCRIPTION OF THE DRAWINGS

FIGS. 1A–1H are cross-sectional views sequentially illustrating steps of fabricating a superconductive electrical conductor in accordance with an embodiment of the present invention;

DESCRIPTION OF THE PREFERRED EMBODIMENTS OF THE INVENTION

Figure 2:
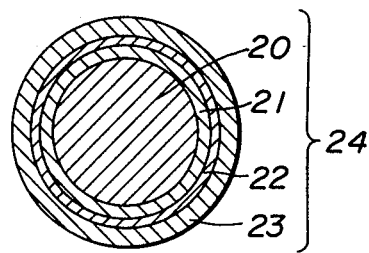
FIG. 2 is a cross-sectional view showing a composite wire element utilized in another embodiment of the present invention.

A method in accordance with the present invention will be described hereunder, taking the case of fabricating an Nb$_3$Sn type superconductive electrical conductor in which Ti is selected as a third element to be added and an assembling of composite wire elements takes place twice.

In fabricating the Nb$_3$Sn type superconductive electrical conductor, an Nb core material 1 in the form of a rod or wire as shown in FIG. 1-(A) is first covered with a tubular thin covering member 2 consisting of highly pure Ti and, then, as shown in FIG. 1-(B) the core material 1 covered with the thin covering member 2 is inserted into a first tubular matrix 3 consisting of a Cu-Sn alloy to form a first composite wire element 4. Subsequently, a reducing working such as swaging, drawing or the like is applied to the first composite wire element 4 to form a second composite wire element 5 having a predetermined diameter as shown in FIG. 1-(C). The reducing working can easily take place, because the thin covering member 2 consisting of highly pure Ti is rich in workability and is thick.

Subsequently, a plurality of such second composite wire elements 5 are assembled as shown in FIG. 1-(D), and are disposed in a second tubular matrix 6 consisting of a Cu-Sn alloy to form a third composite wire element 7. This third composite wire element 7 is then reduced in diameter to form a fourth composite wire element 8 having a predetermined diameter as shown in FIG. 1-(E).

Subsequently, a plurality of such fourth composite wire elements 8 are assembled as shown in FIG. 1-(F) and are disposed in a third tubular matrix 9 consisting of a Cu-Sn alloy to form a fifth composite wire element 10. A reducing working is applied to the fifth composite wire element 10 to provide a multi-core composite wire element 11 as shown in FIG. 1-(G). An Sn plating layer 12 is formed on an outer periphery of the multi-core composite wire element 11 to provide a multi-core plated composite wire element 13. The above-described operations form an assembling step.

Subsequently, a diffusion heat-treatment is applied to the multi-core plated composite wire element 13. Specifically, the diffusion heat-treatment is arrange such that the multi-core plated composite wire element 13 is heated in a vacuum or in inert gas atmosphere at temperatures on the order of 650° to 850° C. for a period of time on the order of 20 to 300 hours. By the diffusion heat-treatment, the diffusion of Nb, Sn and Ti proceeds within the multi-core plated composite wire element 13 and Nb, Sn and Ti react with each other to produce Nb$_3$Sn-Ti around the Nb core material 1, so that there is provided a Nb$_3$Sn type superconductive electrical conductor.

The thus fabricated superconductive electrical conductor is high in critical current value in a high magnetic field range and has superior superconductive characteristics, since Nb$_3$Sn-Ti is produced within the conductor. In addition, the thin covering member 2 composited at the initial stage of the assembling step is soft per se and thin and, further, the diffusion of Ti occurs upon the diffusion heat-treatment and each of the matrices 3, 6 and 9 before the heat-treatment does not contain the third element, so that there is provided a rich workability. Accordingly, the reducing working can easily be done with respect to each of the first composite wire element 4, the third composite wire element 7 and the fifth composite wire element 10.

Furthermore, the amount of Ti contained in the superconductive electrical conductor can freely be set to a desired value by properly selecting the thickness of the thin covering member 2 with which the Nb core material 1 is covered. Since it is unnecessary for the above-described fabricating method to manufacture an alloy containing Ti, the conventionally required special dissolution process becomes unnecessary and the segregation resulting from the alloying does not occur, so that the quality of the conductor is stabilized.

The thin covering member 2 may consist of a high pure material such as Ta, In, Hf, Al, Si or the like. In addition, the thin covering member 2 is not limited to the tubular form, but may be take the form of a foil or a tape.

FIG. 2 shows a first composite wire element 24 utilized in another embodiment of the present invention. The first composite wire element 24 is formed such that an Nb core material 20 is covered with an inner tubular matrix 21 consisting of a Cu-Sn alloy, the inner matrix 21 is then covered with a tubular thin covering member 22 consisting of a third element, and the thin covering member 22 is then covered with a first tubular matrix 23. Operations similar to those applied to the above-described first composite wire element 4 are applied to the first composite wire element 24 to provide a superconductive electrical conductor of Nb$_3$Sn type.

The thus fabricated superconductive electrical conductor can also produce Nb$_3$Sn-Ti efficiently.

Figure 3:
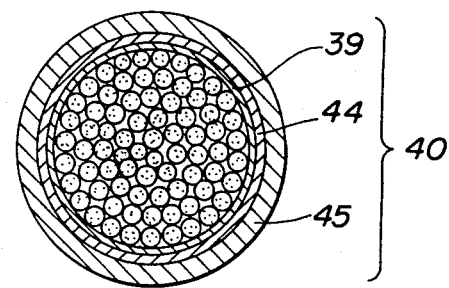
FIG. 3 is a cross-sectional view showing a composite wire element utilized in still another embodiment of the present invention.

FIG. 3 show a fifth composite wire element 40 for use in still another embodiment of the present invention. The fifth composite wire element 40 is arranged such that a third matrix 39 is covered with a thin covering member 44 consisting of a third element, and the thin covering member 44 is covered with an outer matrix 45. Operations similar to those applied to the above-described fifth composite wire element 10 is applied to this fifth composite wire element 40 to provide a superconductive electrical conductor of Nb$_3$Sn type.

In the above-described embodiments of the present invention, the compositing of the thin covering member made of a third element may be performed at any time if the compositing is prior to the diffusion heat-treatment, and a plurality of such thin covering members may be composited. In addition, the assembling of the composite wire elements may take place once or three or more times.

EXAMPLE 1

Figure 4:
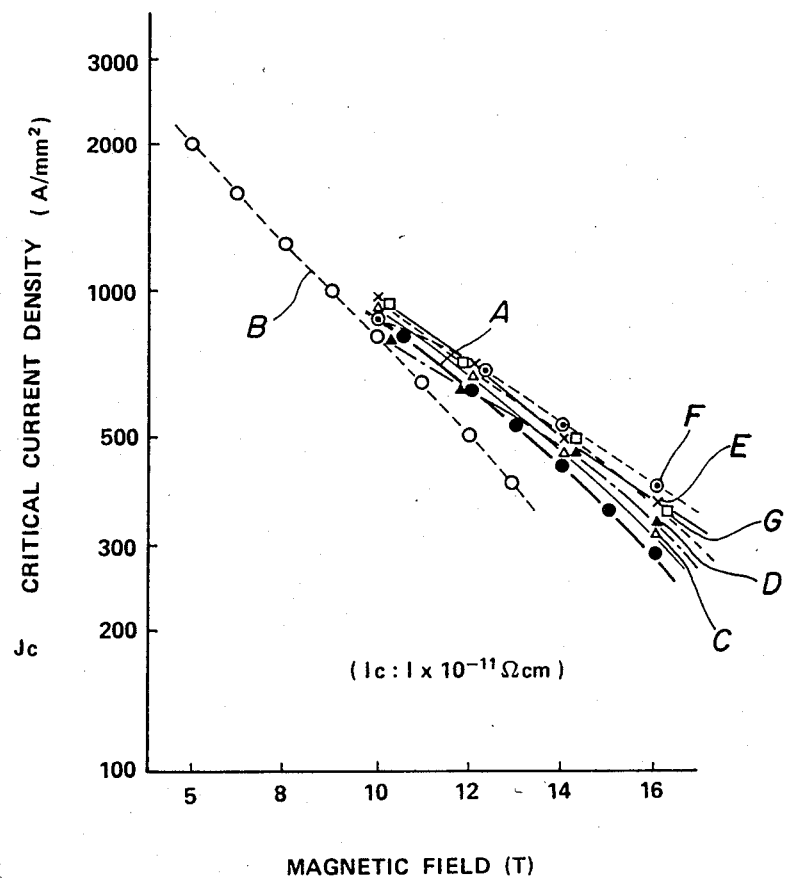
FIG. 4 is a graph showing a comparison of superconductive characteristics of the superconductive electrical conductors fabricated in accordance with the present invention with those of the conventional superconductive electrical conductor.

An Nb rod having an outer diameter of 13 mm covered with a Ti pipe having an outer diameter of 14 mm and a wall thickness of 0.2 mm and an Nb rod having an outer diameter of 13 mm having applied longitudinally thereto a single Ti tape having a thickness of 0.2 mm were inserted respectively in first 6 wt. % Sn bronze (first matrix) tubes each having an outer diameter of 20 mm and a wall thickness of 2 mm, to provide two kinds of first composite wire elements. A reducing working was applied to each of the two kinds of first composite wire elements to draw the same. Subsequently, ninety-one (91) first composite wire elements of one kind were assembled in a second 6 wt. % Sn bronze tube equal in size to the first bronze tube and, similarly, ninety-one (91) first composite wire elements of the other kind were assembled in another second 6 wt. % Sn bronze tube equal in size to the first bronze tube. Each of the two second tubes was drawn to a diameter of 1.1 mm and, subsequently, a pure Sn plating of a 30 μm thickness was applied to an outer peripheral surface of each of the two second tubes. Nineteen (19) of one of the two second tubes were assembled and, similarly, nineteen (19) of the other of the two second tubes were assembled. Subsequently, each of the assembled one tubes and the assembled the other tubes was covered with a Ta tube of a thickness of 0.3 mm as a barrier and a stabilizing copper tube of a thickness of 2 mm and was drawn, to provide two kinds of multi-core composite wires each having an outer diameter of 1.0 mm. A diffusion heat-treatment was applied to each of the two kinds of multi-core composite wires, at 800° C. for 50 hours. Thus, two kinds of superconductive electrical conductor wires were provided. The investigation of superconductive characteristics of the two kinds of conductor wires revealed superior characteristics as shown in FIG. 4. In FIG. 4, the solid line A indicates the characteristics of each of the superconductive electrical conductor wires fabricated such that the Ti pipe and the Ti tape are composited as described above, and the line B indicates the characteristics of the conventional, general superconductive electrical conductor wire of $Nb_3Sn$ type. As will be seen from FIG. 4, it is possible for the superconductive electrical conductor in which the Ti pipe is composited, to obtain a critical current density superior to that of the conventional superconductive electrical conductor, in a magnetic field range above 10T. In addition, the superconductive electrical conductor fabricated such that the Ti tape is composited in a manner described for the above-described wires could also provide characteristics similar to those indicated by the line A in FIG. 4.

Moreover, it was possible to perform the drawing working in the fabrication of the superconductive electrical conductor having composited therein the Ti pipe or Ti tape as described above, more efficiently than the drawing working of the conventional superconductive electrical conductor.

EXAMPLE 2

An Nb rod having an outer diameter of 6 mm covered with a Ti tape disposed longitudinally thereof and having a thickness of 60 μm was inserted in a first 6 wt. % Sn bronze (first matrix) tube having an outer diameter of 10 mm and an inner diameter of 7 mm, to provide a first composite wire element. This first composite wire element was reduced to a diameter of 1.0 mm. Subsequently, ninety-one (91) first composite wire elements thus obtained were assembled in a second 6 wt. % Sn bronze tube having an outer diameter of 13 mm and an inner diameter of 12 mm to form a second composite wire element. This second composite wire element was reduced to a diameter of 1.0 mm and, subsequently, an Sn layer of a 30 μm thickness was electroplated on an outer peripheral surface thereof. Ninety-one (91) of the reduced and electroplated second composite wire elements were assembled and then covered with a Ta tube of a thickness of 0.3 mm as a barrier and a stabilizing copper tube of a thickness of 2 mm. The thus assembled and covered second composite wire elements were drawn to provide a multi-core composite wire having an outer diameter of 1.4 mm. A diffusion heat-treatment was applied to the multi-core composite wire, at 800° C. for 50 hours, to obtain a superconductive electrical conductor wire. The investigation of superconductive characteristics of the wire revealed superior characteristics as indicated by a solid line C in FIG. 4.

EXAMPLE 3

An Nb rod having an outer diameter of 8 mm covered with a Ta tape disposed longitudinally thereof and having a thickness of 20 μm was inserted in a first Cu tube (first matrix) having an outer diameter of 12 mm and an inner diameter of 9 mm, to provide a first composite wire element. This first composite wire element was reduced to a diameter of 1.5 mm. Subsequently, nineteen (19) first composite wire elements thus obtained were assembled in a second Cu tube having an outer diameter of 10 mm and an inner diameter of 8 mm to form a second composite wire element. This second composite wire element was reduced to a diameter of 1.0 mm and, subsequently, an Sn layer of a 60 μm thickness was electroplated on an outer peripheral surface thereof. Ninety-one (91) of the reduced and electroplated second composite wire elements were assembled and then covered in sequence with a Cu tube having an outer diameter of 14 mm and an inner diameter of 13 mm, a Ta tube having an outer diameter of 15 mm and an inner diameter of 14.5 mm as a barrier and a stabilizing copper tube having an outer diameter of 20 mm and an inner diameter of 16 mm. The thus assembled and covered wire elements were drawn to provide a multi-core composite wire having an outer diameter of 1.0 mm. A diffusion heat-treatment was applied to the multi-core composite wire, at 750° C. for 100 hours, to obtain a superconductive electrical conductor wire. The investigation of superconductive characteristics of the wire revealed superior characteristics as indicated by a dot-and-dash line D in FIG. 4.

EXAMPLE 4

An Nb rod having an outer diameter of 8 mm covered with a In tape disposed longitudinally thereof and having a thickness of 10 μm was inserted in a first 13 wt. % Sn bronze tube (first matrix) having an outer diameter of 12 mm and an inner diameter of 9 mm, to provide a first composite wire element. This first composite wire element was reduced to a diameter of 1.5 mm. Subsequently, nineteen (19) first composite wire elements thus obtained were assembled in a second 13 wt. % Sn bronze tube having an outer diameter of 10 mm and an inner diameter of 8 mm to form a second composite wire element. This second composite wire element was reduced to a diameter of 1.0 mm. Ninety-one (91) of the reduced second composite wire elements were assembled and then covered in sequence with a 13 wt. % Sn tube having an outer diameter of 13 mm and an inner diameter of 12 mm, an Nb tube having an outer diameter of 15 mm and an inner diameter of 14 mm as a barrier and a stabilizing copper tube having an outer diameter of 20 mm and an inner diameter of 16 mm. The thus assembled and covered wire elements were drawn to provide a multi-core composite wire having an outer diameter of 1.0 mm. A diffusion heat-treatment was then applied to the multi-core composite wire, at 750° C. for 100 hours, to obtain a superconductive electrical conductor wire. The investigation of superconductive characteristics of the wire revealed superior characteristics as indicated by a solid line E in FIG. 4.

EXAMPLE 5

An Nb rod having an outer diameter of 13 mm covered with an Hf tube having an outer diameter of 14 mm and a thickness of 0.2 mm was inserted in a first 6 wt. % Sn bronze tube having an outer diameter of 20 mm and an inner diameter of 15 mm, to provide a first composite wire element. This first composite wire element was reduced to a diameter of 1.0 mm. Subsequently, ninety-one (91) first composite wire elements thus obtained were assembled in a second 6 wt. % Sn bronze tube having an outer diameter of 13 mm and an inner diameter of 12 mm to form a second composite wire element. This second composite wire element was reduced to a diameter of 1.1 mm, and then a layer of a pure Sn is plated on the peripheral surface thereof. Nineteen (19) of the reduced and plated second composite wire elements were assembled in a 6 wt. % Sn bronze tube having in outer diameter of 7 mm and an inner diameter of 6 mm, and then covered with a Ta tube having an outer diameter of 8.5 mm and an inner diameter of 7.5 mm as a barrier and a stabilizing copper tube having an outer diameter of 13 mm and an inner diameter of 9 mm. The thus assembled and covered wire elements were drawn to provide a multi-core composite wire having an outer diameter of 1.0 mm. A diffusion heat-treatment was then applied to the multi-core composite wire, at 800° C. for 50 hours, to obtain an $Nb_3Sn$-type superconductive electrical conductor wire. The investigation of superconductive characteristics of the wire revealed superior characteristics as indicated by a broken line F in FIG. 4.

EXAMPLE 6

An Nb rod having an outer diameter of 6 mm was covered with a first 14 wt. % Sn bronze tube having an outer diameter of 8 mm and an inner diameter of 7 mm, and then reduced to a diameter of 4 mm. This reduced rod was subsequently covered with an Al tape disposed longitudinally thereof and having a thickness of 0.1 mm, and then inserted in a second 14 wt. % Sn bronze tube having an outer diameter of 7 mm and an inner diameter of 5 mm, to provide a first composite wire element. This first composite wire element was reduced to a diameter of 1.0 mm. Subsequently, ninety-one (91) first composite wire elements thus obtained were assembled in a third 14 wt. % Sn bronze tube having an outer diameter of 13 mm and an inner diameter of 12 mm to form a second composite wire element. This second composite wire element was reduced to a diameter of 1.1 mm. Nineteen (19) of the reduced second composite wire elements were assembled and then covered with a Ta tube having an outer diameter of 6.5 mm and an inner diameter of 6 mm as a barrier and a stabilizing copper tube having an outer diameter of 11 mm and an inner diameter of 7 mm. The thus assembled and covered wire elements were drawn to provide a multi-core composite wire having an outer diameter of 1.0 mm. A diffusion heat-treatment was then applied to the multi-core composite wire, at 725° C. for 50 hours, to obtain an $Nb_3Sn$-type superconductive electrical conductor wire. The investigation of superconductive characteristics of the wire revealed superior characteristics as indicated by a broken line G in FIG. 4.

As described above, the present invention is arranged such that prior to the diffusion heat-treatment, the highly pure thin covering member consisting of the third element for improving the critical current value of $Nb_3Sn$ in a high magnetic field range is composited outwardly of the Nb core material. Such covering members made of various third elements and of various thickness are commercially available. With this arrangement of the present invention, therefore, it is possible to facilitate the working by the compositing of the thin covering member of a third element having high purity and thin in wall thickness. In this case, the covering member is selected from those having good malleability. It is also possible to fabricate the superconductive electrical conductor having improved superconductive characteristics in high magnetic field range. Furthermore, the amount of the third element contained in the superconductive electrical conductor can be easily set to a desired value by properly selecting the wall thickness of the thin covering member. Also such covering member made of the third element is uniform in thickness and free from surface defects, so that a superconductive electrical conductor wire of a high quality can be obtained. Moreover, if the superconductive electrical conductor is fabricated in accordance with the present invention, the dissolution treatment which has conventionally been essential becomes unnecessary so that it is possible to lower the manufacturing cost, and it also becomes unnecessary to manufacture an alloy containing the third element so that a problem of segregation can be solved and the quality is improved. Furthermore, since the diffusion of the third element into the matrix is performed by the diffusion heat-treatment, the working prior to the diffusion heat-treatment can be advantageously facilitated.

What is claimed is:
1. A method of fabricating a superconductive electrical conductor of $Nb_3Sn$ type comprising the steps of:
   covering an elongated core member made of Nb with a covering member consisting of a third element for improvement of a critical current of $Nb_3Sn$ contained in the superconductive electrical conductor;
   covering said elongated core member covered with said covering member with a first tubular matrix made of any one of a Cu-Sn alloy and a combination of Cu with Sn to form a first composite wire element;

reducing said first composite wire element to a predetermined diameter to form a second composite wire element;

assembling a predetermined number of said second composite wire elements in a second tubular matrix made of any one of a Cu-Sn alloy, Cu and a combination of Cu with Sn to form a third composite wire element;

reducing said third composite wire element to a predetermined diameter to form a fourth composite wire element;

assembling a predetermined number of said fourth composite wire elements in a third tubular matrix made of any one of a Cu-Sn alloy, Cu and a combination of Cu with Sn, and subsequently reducing said third tubular matrix having therein said fourth composite wire elements to a predetermined diameter to form a multi-core composite wire; and subjecting said multi-core composite wire to a diffusion heat-treatment to form an intermetallic compound of $Nb_3Sn$ and said third element in a peripheral portion of said Nb core member.

2. A method of fabricating a superconductive electrical conductor according to claim 1, wherein said multi-core composite wire before said step of diffusion heat-treatment is further subjected to at least one step of assembling processing wherein a predetermined number of said multi-core composite wires are assembled in a fourth tubular matrix made of any one of a Cu-Sn alloy, Cu and a combination of Cu with Sn, and subsequently reduced to a predetermined diameter to form another multi-core composite wire to be subjected to said diffusion heat-treatment.

3. A method of fabricating a superconductive electrical conductor according to claim 1 further comprising, before said step of diffusion heat-treatment, the step of covering any one of said second and fourth composite wire elements and said multi-core composite wires with a second covering member made of said third element.

4. A method of fabricating a superconductive electrical conductor according to claim 2 further comprising, before said step of diffusion heat-treatment, the step of covering any one of said second and fourth composite wire elements and said multi-core composite wires with a second covering member made of said third element.

5. A method of fabricating a superconductive electrical conductor according to claim 1 or claim 2, wherein any one of said second to fourth tubular matrix is plated with a layer of Sn at an outer peripheral surface thereof.

6. A method of fabricating a superconductive electrical conductor according to any one of claims 1 to 4 further comprising, before said step of diffusion heat-treatment, the step of covering any one of said second and fourth composite wire elements and said multi-core composite wires with a tubular member made of a material which functions as a barrier to said third element.

7. A method of fabricating a superconductive electrical conductor according to claim 6 further comprising, after said covering step with said tubular member of the barrier material, the step of covering said tubular member of the barrier material with a stabilizing copper tube.

8. A method of fabricating a superconductive electrical conductor according to claim 6 further comprising, after said assembling step of the composite wire elements covered with said tubular member of the barrier material, with a stabilizing copper tube.

9. A method of fabricating a superconductive electrical conductor according to claim 1, wherein said third element is selected from the group consisting of Ti, Ta, In, Hf, Al and Si.

10. A method of fabricating a superconductive electrical conductor according to claim 9, wherein said core member takes the form of any one of a tube, a foil and a tape.

* * * * *